(12) United States Patent
Zhao et al.

(10) Patent No.: US 11,925,100 B2
(45) Date of Patent: Mar. 5, 2024

(54) DISPLAY MODULE AND DISPLAY DEVICE

(71) Applicant: Wuhan Tianma Micro-Electronics Co., Ltd., Wuhan (CN)

(72) Inventors: Xiangwei Zhao, Wuhan (CN); Jiang Li, Wuhan (CN); Guancheng Xiao, Wuhan (CN); Ruiyuan Zhou, Wuhan (CN)

(73) Assignee: Wuhan Tianma Micro-Electronics Co., Ltd., Wuhan (CN)

(*) Notice: Subject to any disclaimer, the term of this patent is extended or adjusted under 35 U.S.C. 154(b) by 399 days.

(21) Appl. No.: 17/465,438

(22) Filed: Sep. 2, 2021

(65) Prior Publication Data
US 2021/0399244 A1 Dec. 23, 2021

(30) Foreign Application Priority Data
Mar. 10, 2021 (CN) .......................... 202110260902.9

(51) Int. Cl.
*H10K 77/10* (2023.01)
*B32B 5/18* (2006.01)
(Continued)

(52) U.S. Cl.
CPC .............. *H10K 77/111* (2023.02); *B32B 5/18* (2013.01); *B32B 7/12* (2013.01); *B32B 15/046* (2013.01);
(Continued)

(58) Field of Classification Search
CPC ................ H10K 77/111; H10K 59/12; H10K 2102/311; B32B 5/18; B32B 7/12; B32B 15/046; B32B 15/09; B32B 15/20; B32B 27/36; B32B 2266/0214; B32B 2457/20; B32B 2255/20; B32B 2307/748;
(Continued)

(56) References Cited

U.S. PATENT DOCUMENTS 9,287,329 B1 * 3/2016 Lee .................... H10K 50/8426

FOREIGN PATENT DOCUMENTS

CN 109979327 A 7/2019
CN 108735103 B 9/2019

* cited by examiner

*Primary Examiner* — Kyoung Lee
(74) *Attorney, Agent, or Firm* — Alston & Bird LLP

(57) ABSTRACT

A display module includes substrate and adhesive portion. Substrate includes display portion, bending portion and bonding portion located on non-light-emitting side of display portion. Bending portion is located between display portion and bonding portion. Adhesive portion includes first adhesive portion including first adhesive sub-portion and second adhesive sub-portion located on side of first adhesive sub-portion facing away from bending portion. Bonding portion includes first bonding sub-portion at least partially overlapping first adhesive sub-portion in a first direction and second bonding sub-portion located on side of first bonding sub-portion facing away from bending portion at least partially overlapping second adhesive sub-portion in the first direction. In a first state, the distance between first bonding sub-portion and display portion is greater than the distance between second bonding sub-portion and display portion in first direction, thereby alleviating stress bonding portion withstands, and ensuring normal operation of display module in first state.

20 Claims, 9 Drawing Sheets

(51) Int. Cl.
*B32B 7/12* (2006.01)
*B32B 15/04* (2006.01)
*B32B 15/09* (2006.01)
*B32B 15/20* (2006.01)
*B32B 27/36* (2006.01)
*C09J 7/38* (2018.01)
*H10K 59/12* (2023.01)
*H10K 102/00* (2023.01)

(52) U.S. Cl.
CPC .............. B32B 15/09 (2013.01); B32B 15/20 (2013.01); B32B 27/36 (2013.01); C09J 7/385 (2018.01); H10K 59/12 (2023.02); *B32B 2266/0214* (2013.01); *B32B 2457/20* (2013.01); *C09J 2203/326* (2013.01); *C09J 2400/10* (2013.01); *C09J 2433/00* (2013.01); *H10K 2102/311* (2023.02)

(58) Field of Classification Search
CPC ......... B32B 3/04; B32B 3/266; B32B 27/065; B32B 2307/546; B32B 7/14; B32B 15/08; B32B 27/281; C09J 7/385; C09J 2203/326; C09J 2400/10; C09J 2433/00; G09F 9/301
See application file for complete search history.

DISPLAY MODULE AND DISPLAY DEVICE

CROSS-REFERENCE TO RELATED APPLICATION(S)

This application claims priority to Chinese Patent Application No. 202110260902.9 filed Mar. 10, 2021, entitled "DISPLAY MODULE AND DISPLAY DEVICE", the disclosure of which is incorporated herein by reference in its entirety.

TECHNICAL FIELD

The present disclosure relates to the field of display technologies and, in particular, to a display module and a display device.

BACKGROUND

An active-matrix organic light emitting diode (AMOLED), with the characteristics of fast reaction speed and high contrast, is gradually applied to the field of display technologies, and is developed towards a trend of low power consumption, low cost and large size.

To seek a full screen display in the existing AMOLED display technologies, a bonding portion used for bonding a driver circuit is usually bent to a non-light-emitting side of a display portion, that is, a substrate of a display panel needs is bent 180°, so that the bonding portion is subjected to a high stress. When the bonding portion is subject to an external squeezing force or deformation force, it is easily deformed and a failure results in the display panel.

SUMMARY

Embodiments of the present disclosure provide a display module and a display device that alleviates stresses on a bonding portion while the bonding portion is in a first state and ensures the display module operates normally.

In a first aspect, an embodiment of the present disclosure provides a display module. The display module includes a substrate. The substrate includes a display portion, a bending portion and a bonding portion. The bending portion is located between the display portion and the bonding portion, and the bonding portion is located on a non-light-emitting side of the display portion.

The display module further includes an adhesive portion. The adhesive portion adheres the display portion to the bonding portion.

The adhesive portion includes a first adhesive portion. The first adhesive portion includes a first adhesive sub-portion and a second adhesive sub-portion, the second adhesive sub-portion is located at a side of the first adhesive sub-portion facing away from the bending portion.

The bonding portion includes a first bonding sub-portion and a second bonding sub-portion, the second bonding sub-portion is located at a side of the first bonding sub-portion facing away from the bending portion, and the first bonding sub-portion and the first adhesive sub-portion are at least partially overlapped in a first direction, the second bonding sub-portion and the second adhesive sub-portion are at least partially overlapped in the first direction, and the first direction intersects a light-emitting surface of the display module.

In a first state, a distance between the first bonding sub-portion and the display portion is greater than a distance between the second bonding sub-portion and the display portion in the first direction.

In a second aspect, an embodiment of the present disclosure provides a display device. The display device includes the display module described in the first aspect.

For a display module provided by the embodiment of the present disclosure, the bonding portion is configured to include the first bonding sub-portion and the second bonding sub-portion, the second bonding sub-portion is located at a side of the first bonding sub-portion facing away from the bending portion. Meanwhile, the adhesive portion is configured to include the first adhesive portion, the first adhesive portion includes the first adhesive sub-portion and the second adhesive sub-portion, the second adhesive sub-portion is located at a side of the first adhesive sub-portion facing away from the bending portion. In the first direction intersecting the light-emitting surface of the display module, the first bonding sub-portion and the first adhesive sub-portion are at least partially overlapped, and the second bonding sub-portion and the second adhesive sub-portion are at least partially overlapped. In the first state, along the first direction, the distance between the first bonding sub-portion and the display portion is greater than the distance between the second bonding sub-portion and the display portion, so that a stress withstood by the bonding portion is at least partially alleviated to ensure normal operation of the display module.

DETAILED DESCRIPTION

Figure 1:
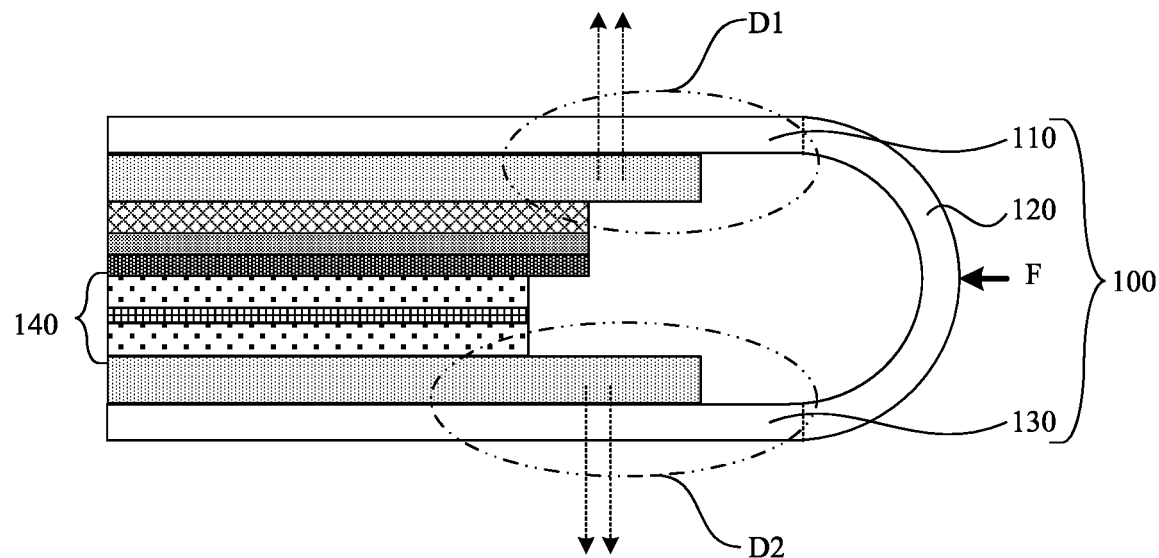
FIG. 1 is a schematic structural diagram of a display module in a related art.

The present disclosure is further described hereinafter in detail in conjunction with drawings and embodiments. It is to be understood that embodiments described hereinafter are intended to illustrate the present disclosure rather than to limit the present disclosure. Additionally, it is to be noted that for ease of description, only part, not all, of structures related to the present disclosure are illustrated in the drawings.

FIG. 1 is a schematic structural diagram of a display module in the existing art. As shown in FIG. 1, to achieve a full screen display in the existing AMOLED display technologies, a substrate 100 of the display module 10 includes a display portion 110, a bending portion 120, and a bonding portion 130. The bonding portion 130 is provided at a non-light-emitting side of the display portion 110 and is connected to the display portion 110 through the bending portion 120. The display portion 110 adheres to the bonding portion 130 through the adhesive portion 140. Since the substrate 100 is bent 180°, a stress point is mainly concentrated at an arc center position F of the bending portion 120, so that when the bending portion 120 is subject to a squeezing force or a pressure is applied at the arc center position F, the bending portion 120 of the substrate 100 is deformed, and a tensile stress at position D1 of the substrate 100 and a tensile stress at position D2 of the substrate 100 expand outward simultaneously to increase a peel stress, which can easily lead to a failure of the display panel.

To solve the preceding problems, embodiments of the present disclosure provide a display module and a display device, such that a bonding portion can reasonably and appropriately bend when the bending portion of the substrate is squeezed, and such that a peel stress at the bonding portion is at least partially alleviated, thereby effectively avoiding failure of the display panel, and ensuring normal operation of the display module.

The display module provided by an embodiment of the present disclosure includes a substrate. The substrate includes a display portion, a bending portion and a bonding portion. The bending portion is located between the display portion and the bonding portion, and the bonding portion is located on a non-light-emitting side of the display portion.

The display module further includes an adhesive portion. The adhesive portion adheres the display portion to the bonding portion.

The adhesive portion includes a first adhesive portion. The first adhesive portion includes a first adhesive sub-portion and a second adhesive sub-portion, the second adhesive sub-portion is located at a side of the first adhesive sub-portion facing away from the bending portion.

The bonding portion includes a first bonding sub-portion and a second bonding sub-portion. The second bonding sub-portion is located at a side of the first bonding sub-portion facing away from the bending portion, and the first bonding sub-portion and the first adhesive sub-portion are at least partially overlapped in a first direction, the second bonding sub-portion and the second adhesive sub-portion are at least partially overlapped in the first direction, and the first direction intersects a light-emitting surface of the display module.

In a first state, a distance between the first bonding sub-portion and the display portion is greater than a distance between the second bonding sub-portion and the display portion in the first direction.

In the display module provided by the embodiments of the present disclosure, the bonding portion includes the first bonding sub-portion and the second bonding sub-portion, the second bonding sub-portion is located at a side of the first bonding sub-portion facing away from the bending portion. Meanwhile, the adhesive portion includes the first adhesive portion, the first adhesive portion includes the first adhesive sub-portion and the second adhesive sub-portion, the second adhesive sub-portion is located at a side of the first adhesive sub-portion facing away from the bending portion. In the first direction intersecting the light-emitting surface of the display module, the first bonding sub-portion and the first adhesive sub-portion are at least partially overlapped, and the second bonding sub-portion and the second adhesive sub-portion are at least partially overlapped. In the first state, along the first direction, the distance between the first bonding sub-portion and the display portion is greater than the distance between the second bonding sub-portion and the display portion, so that the stress withstood by the bonding sub-portion is effectively alleviated to ensure normal operation of the display module.

Based on embodiments of the present disclosure, all other embodiments obtained by those of ordinary skill in the art without creative work are within the scope of the present disclosure.

Figure 2:
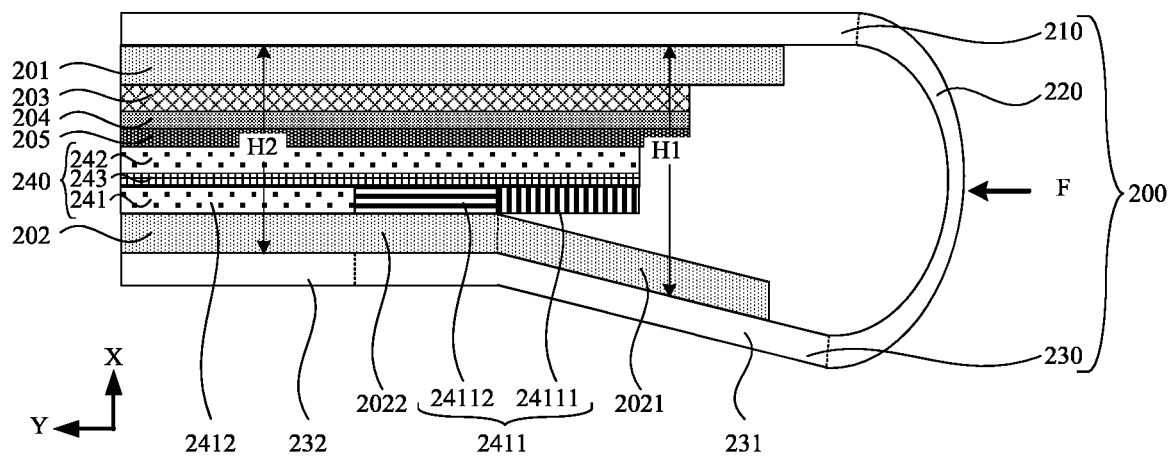
FIG. 2 is a schematic structural diagram of a display module provided by an embodiment of the present disclosure.
Figure 3:
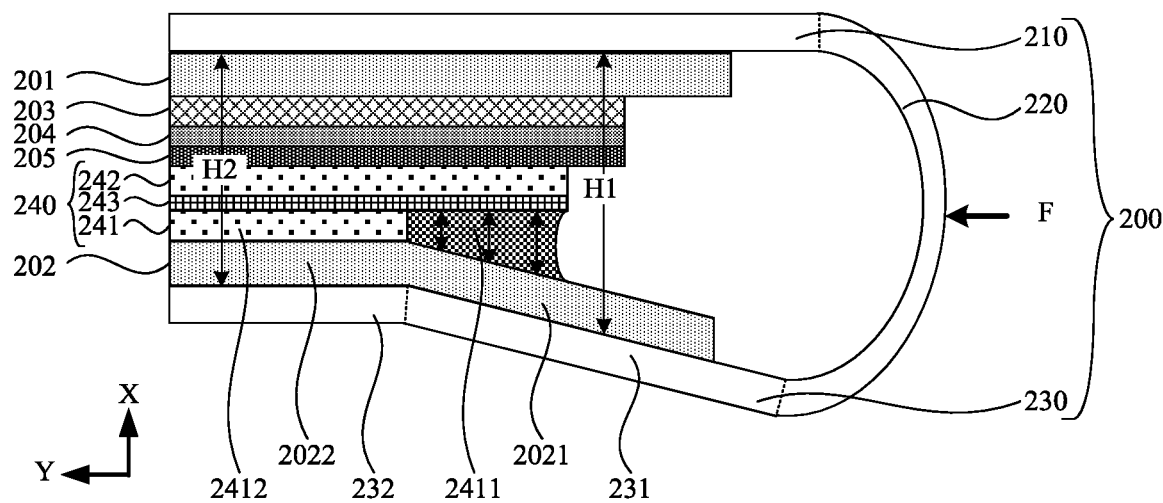
FIG. 3 is a schematic structural diagram of a display module provided by another embodiment of the present disclosure.

FIG. 2 is a schematic structural diagram of a display module provided by an embodiment of the present disclosure. FIG. 3 is a schematic structural diagram of a display module provided by another embodiment of the present disclosure. Referring to FIGS. 2 and 3, the display module 20 includes a substrate 200. The substrate 200 includes a display portion 210, a bending portion 220 and a bonding portion 230. The bending portion 220 is located between the display portion 210 and the bonding portion 230, and the bonding portion 230 is located on a non-light-emitting side of the display portion 210. The display module 20 further includes an adhesive portion 240. The adhesive portion 240 is used to adhere the display portion 210 to the bonding portion 230.

The adhesive portion 240 includes a first adhesive portion 241. The first adhesive portion 241 includes a first adhesive sub-portion 2411 and a second adhesive sub-portion 2412, the second adhesive sub-portion 2412 is located at a side of the first adhesive sub-portion 2411 facing away from the bending portion 220. The bonding portion 230 includes a first bonding sub-portion 231 and a second bonding sub-portion 232. The second bonding sub-portion 232 is located at a side of the first bonding sub-portion 231 facing away from the bending portion 220, and the first bonding sub-portion 231 and the first adhesive sub-portion 2411 are at least partially overlapped in a first direction (an x-direction as shown in the figure), the second bonding sub-portion 232 and the second adhesive sub-portion 2412 at least partially overlap in the first direction, and the first direction intersects a light-emitting surface of the display module 20. In a first state, a distance H1 between the first bonding sub-portion 231 and the display portion 210 is greater than a distance H2 between the second bonding sub-portion 232 and the display portion 210 in the first direction.

It is to be noted that the substrate 200 provided by an embodiment of the present disclosure may be any flexible, integrally-formed substrate base. To better explain the technical solution of the embodiment of the present disclosure, the display portion 210 and the bending portion 220 are schematically separated by a dashed line, the bending portion 220 and the bonding portion 230 are schematically separated by a dashed line, and the first bonding sub-portion 231 and the second bonding sub-portion 232 are schematically separated by a dashed line. It is to be noted that in the first direction, the distance H1 between the first bonding sub-portion 231 and the display portion 210 may be a distance in the first direction between any position of the first bonding sub-portion 231 and the display sub-portion 210 except for an intersection position between the first bonding sub-portion 231 and the second bonding sub-portion 232. For example, the distance H1 between the first bonding sub-portion 231 and the display sub-portion 210 may be a distance between a central position of the first bonding sub-portion 231 and the display portion 210. As another example, the distance H1 between the first bonding sub-portion 231 and the display portion 210 may be a distance between an endpoint position of the first bonding sub-portion 231 facing the bending portion 220 and the display portion 210, which is not intend to be limited in the embodiment of the present disclosure. On the other hand, in the first direction, the distance H1 between the first bonding sub-portion 231 and the display portion 210 may be a vertical distance between a surface of the first bonding sub-portion 231 facing the display portion 210 and a surface of the display portion 210 facing the first bonding sub-portion 231. Correspondingly, the distance H2 between the second bonding sub-portion 232 and the display portion 210 may be a vertical distance between a surface of the second bonding sub-portion 232 facing the display portion 210 and a surface of the display portion 210 facing the second bonding sub-portion 232. If each of the first bonding sub-portion 231, the second bonding sub-portion 232, and the display portion 210 has a certain thickness, the distance H1 between the first bonding sub-portion 231 and the display portion 210 in the first direction may be a vertical distance between a surface of a side of the first bonding sub-portion 231 facing away from the display portion 210 and a surface of a side of the display portion 210 facing away from the first bonding sub-portion 231. Correspondingly, the distance H2 between the second bonding sub-portion 232 and the display portion 210 may be a vertical distance between a surface of a side of the second bonding sub-portion 232 facing away from the display portion 210 and a surface of a side of the display portion 210 facing away from the second bonding sub-portion 232. In the first direction, the distance H1 between the first bonding sub-portion 231 and the display portion 210 may be a vertical distance between a surface of a side of the first bonding sub-portion 231 facing the display portion 210 and a surface of a side of the display portion 210 facing away from the first bonding sub-portion 231. Correspondingly, the distance H2 between the second bonding sub-portion 232 and the display portion 210 may be a vertical distance between a surface of a side of the second bonding sub-portion 232 facing the display portion 210 and a surface of a side of the display portion 210 facing away from the second bonding sub-portion 232. The distance H1 between the first bonding sub-portion 231 and the display portion 210 may also be a vertical distance between a surface of a side of the first bonding sub-portion 231 facing away from the display portion 210 and a surface of a side of the display portion 210 facing the first bonding sub-portion 231. Correspondingly, the distance H2 between the second bonding sub-portion 232 and the display portion 210 may be a vertical distance between a surface of a side of the second bonding sub-portion 232 facing away from the display portion 210 and a surface of a side of the display portion 210 facing away from the second bonding sub-portion 232. For example, the first state may refer to a state in which the bending portion 220 is subjected to an external stress, for example, the bending portion 220 is squeezed or is subjected to a stress at an arc center position of the bending portion 220. In a case where the bending portion 220 is subjected to the external stress, to alleviate the stress at the bonding portion 230, the technical solution provided by the embodiments of the present disclosure provides that the first bonding sub-portion 231 is appropriately facing away from the display portion 210, thus part of the stress applied to the bonding portion 230 is alleviated while the bonding portion 230 is adhered to the display portion 210 without separating, thereby effectively avoiding a failure of the display module 20 as a result of an external stress applied to the bending portion 220.

In the first state, in a case where the distance H1 between the first bonding sub-portion 231 and the display portion 210 is greater than the distance H2 between the second bonding sub-portion 232 and the display portion 210 in the first direction, the first bonding sub-portion 231 may be appropriately distanced from the display portion 210, which specifically may be achieved by incorporating different types of adhesives for the first adhesive sub-portion 2411 and the second adhesive sub-portion 2412. For example, a special adhesive may be adopted for the first adhesive sub-portion 2411, where an adhesion force or a shape of the special adhesive can change with a peel stress. That is, in a case where the peel stress applied to the first adhesive sub-portion 2411 is relatively small, the first adhesive sub-portion 2411 may maintain an at least substantially unchanged distance between the first bonding sub-portion 231 and the display portion 210, and in a case where the peel stress applied to the first adhesive sub-portion 2411 is relatively large, such that the first adhesive sub-portion 2411 may cause the first bonding sub-portion 231 to face away from the display portion 210, thus releasing part of the peel stress. Furthermore, an ordinary adhesive may be utilized as the second adhesive sub-portion 2412 as long as the second adhesive sub-portion 2412 and the second bonding sub-portion 232 are bonded and fixed.

Referring to FIGS. 2 and 3, the adhesive portion 240 of the display module 20 may further include a second adhesive portion 242 and a polyethylene terephthalate (PET) layer 243 between the first adhesive portion 241 and the second adhesive portion 242. The second adhesive portion 242 may be used for bonding the display portion 210, and the PET layer 243 may be served as a configuration substrate for the first adhesive portion 241 and the second adhesive portion 242 to achieve a double-sided adhesion for the adhesive portion 240 with the display portion 210 and the bonding portion 230.

Furthermore, the display module 20 may further include a first support layer 201 and a second support layer 202 both located between the display portion 210 and the bonding portion 230. The first support layer 201 and the second support layer 202 are used for support and protection. The first support layer 201 supports the display portion 210 and the second support layer 202 supports the bonding portion 230. Furthermore, the second support layer 202 may include a first support sub-portion 2021 and a second support sub-portion 2022, the first support sub-portion 2021 is located at a side of the second support sub-portion 2022 facing the bending portion 220. In a first direction, the first support sub-portion 2021 and the first bonding sub-portion 231 are at least partially overlapped for supporting the first bonding sub-portion 231. In the first direction, the second support sub-portion 2022 and the second bonding sub-portion 232 are at least partially overlapped for supporting the second bonding sub-portion 232. In the first state, that is, when the bending portion 220 is subjected to a stress, the first bonding sub-portion 231 is appropriately facing away from the display portion 210, and it can be understood that the first supporting sub-portion 2021 is appropriately facing away from the display portion 210 together with the first bonding sub-portion 231. It is to be noted that the second support layer 202 is integrally formed, and for better illustration, the second support layer 202 is schematically divided into a first support sub-portion 2021 and a second support sub-portion 2022 by a dashed line.

Furthermore, the display module 20 may further include a foam 203 and a flexible polyimide (PI) layer 204 for buffering and releasing the stress, and a copper foil layer 205 for supporting, for releasing static electricity and for radiating heat, wherein the foam 203, the flexible PI layer 204 and the copper foil layer 205 are located between the display portion 210 and the bonding portion 230.

It is to be noted that, in a direction pointing away from the first adhesive sub-portion 2411 and toward the second adhesive sub-portion 2412 (a Y direction as shown in the figure), extension lengths of the first adhesive sub-portion 2411 and the second adhesive sub-portion 2412 are not limited to any particular lengths in accordance with embodiments of the present disclosure, and an extension length of the first bonding sub-portion 231 and an extension length of the second bonding sub-portion 232 are not limited in accordance with embodiments of the present disclosure. However, in the first direction, a thickness of the first adhesive sub-portion 2411 and a thickness of the second adhesive sub-portion 2412 may be equal, and a thickness of the first bonding sub-portion 231 and a thickness of the second bonding sub-portion 232 may be equal.

In the display module provided by the embodiment of the present disclosure, the first adhesive portion is configured to include the first adhesive sub-portion and the second adhesive sub-portion, and the second adhesive sub-portion is located at a side of the first adhesive sub-portion facing away from the bending portion. In addition, in the first direction intersecting a light-emitting surface of the display module, the first bonding sub-portion and the first adhesive sub-portion of the bonding portion are at least partially overlapped, the second adhesive sub-portion and the second adhesive sub-portion of the bonding portion are at least partially overlapped, so that in the first state, along the first direction, the distance between the first bonding sub-portion and the display portion is greater than the distance between the second bonding sub-portion and the display portion, the stress that the bonding portion withstands is alleviated, and the normal operation of the display module is ensured.

A specific implementation of the first adhesive sub-portion 2411 may include various features and configurations in accordance with the above-described embodiments. For example, the first adhesive sub-portion 2411 may include a pressure sensitive adhesive and/or a stretchable adhesive. The implementation of the first adhesive sub-portion 2411 is described below in detail in several available embodiments.

First, an embodiment in which the first adhesive sub-portion 2411 includes the pressure sensitive adhesive is described in detail.

With reference to the embodiment illustrated in FIG. 2, the first adhesive sub-portion 2411 may include a pressure sensitive adhesive. In the first state, at least a side of the first adhesive sub-portion 2411 facing the bending portion 220 is separated from the first bonding sub-portion 231.

The pressure sensitive adhesive is sensitive to pressure, and its adhesion force can change with a tensile stress, i.e. change with the peel stress. In a case where the peel stress applied to the adhesive exceeds an ultimate stress value, the pressure sensitive adhesive may lose adhesion and no longer has the adhesion force. In the case where the pressure sensitive adhesive is adopted for the first adhesive sub-portion 2411, in a case where the peel stress applied to the first adhesive sub-portion 2411 is within the ultimate stress value of the pressure sensitive adhesive, the pressure sensitive adhesive still has the adhesion, and the first adhesive sub-portion 2411 can continue to bond the first bonding sub-portion 231 and keep the distance between the first bonding sub-portion 231 and the display portion 210 unchanged. In a case where the peel stress applied to the first adhesive sub-portion 2411 exceeds the ultimate stress value of the pressure sensitive adhesive, the pressure sensitive adhesive loses the adhesion, and the first adhesive sub-portion 2411 is separated from the first bonding sub-portion 231, so that the first bonding sub-portion 231 is facing away from the display portion 210. In the first state, that is, in the state where the bending portion 220 is subjected to the stress, at least a side of the first adhesive sub-portion 2411 facing the bending portion 220 is separated from the first bonding sub-portion 231, so that a gap is at least formed between the side of the first adhesive sub-portion 2411 facing the bending portion 220 and the first bonding sub-portion 231, and part of the stress can be released through the gap, thereby reducing the stress applied to the first bonding sub-portion 231 and avoiding the failure of the first bonding sub-portion 231.

In an embodiment, referring to FIG. 2, the first adhesive sub-portion 2411 may include at least a first pressure sensitive adhesive 24111 and a second pressure sensitive adhesive 24112. The second pressure sensitive adhesive 24112 is located at a side of the first pressure sensitive adhesive 24111 facing away from the bending portion 220. A pressure sensing coefficient of the first pressure sensitive adhesive 24111 is smaller than a pressure sensing coefficient of the second pressure sensitive adhesive 24112. In the first state, at least the first pressure sensitive adhesive 24111 is separated from the first bonding sub-portion 231.

The pressure sensing coefficient of the pressure sensitive adhesive is a coefficient showing a relationship of the adhesion force of the pressure sensitive adhesive varying with the peel stress. The pressure sensing coefficient is an inherent property of the pressure sensitive adhesive and is related to the material of the pressure sensitive adhesive. Once the pressure sensitive adhesive has been processed, the pressure sensing coefficient of the pressure sensitive adhesive is determined. The smaller the pressure sensing coefficient of the pressure sensitive adhesive is, the smaller the ultimate stress value that the pressure sensitive adhesive can withstand, that is, generally, the pressure sensitive adhesive loses the adhesion under a smaller stress. The greater the pressure sensing coefficient of pressure sensitive adhesive is, the greater the ultimate stress value that the pressure sensitive adhesive can withstand, that is, generally, the pressure sensitive adhesive loses adhesive properties under greater levels of stress. Since the pressure sensing coefficient of the first pressure sensitive adhesive 24111 is smaller than the pressure sensing coefficient of the second pressure sensitive adhesive 24112, in the first state, at least the first pressure sensitive adhesive 24111 fails and is separated from the first bonding sub-portion 231, and at least a gap is formed between the first pressure sensitive adhesive 24111 and the first bonding sub-portion 231 to release the stress, thereby avoiding the failure of the first bonding sub-portion 231.

Figure 4:
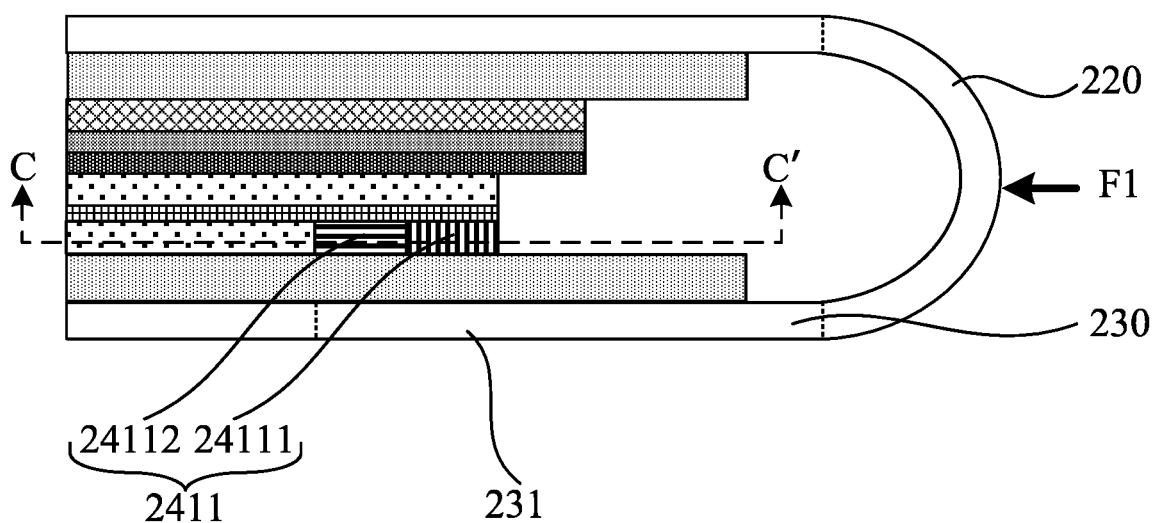
FIG. 4 is a schematic structural diagram of a display module according to FIG. 2, under a stress F1.
Figure 5:
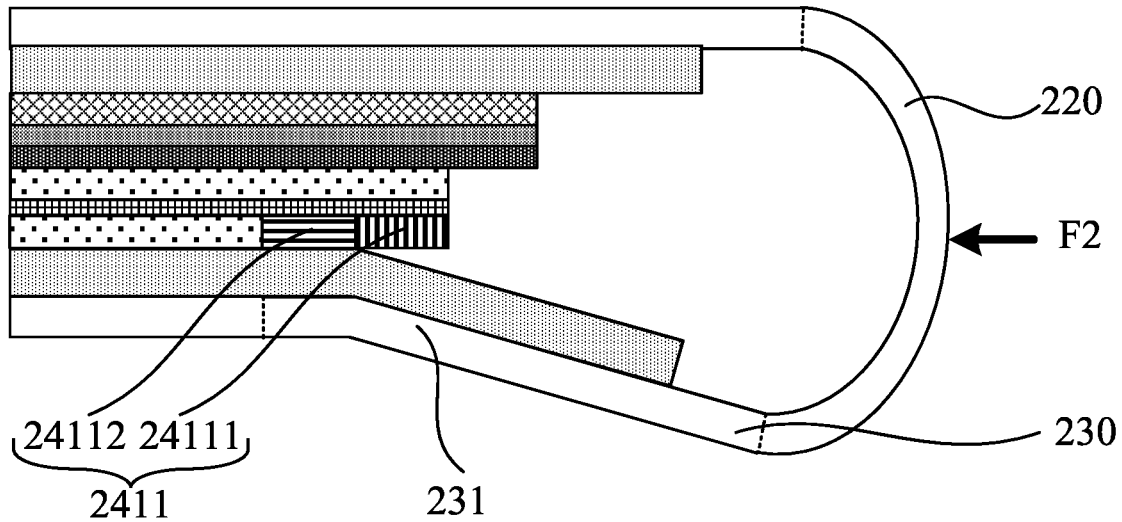
FIG. 5 is a schematic structural diagram of a display module according to FIG. 2, under a stress F2.
Figure 6:
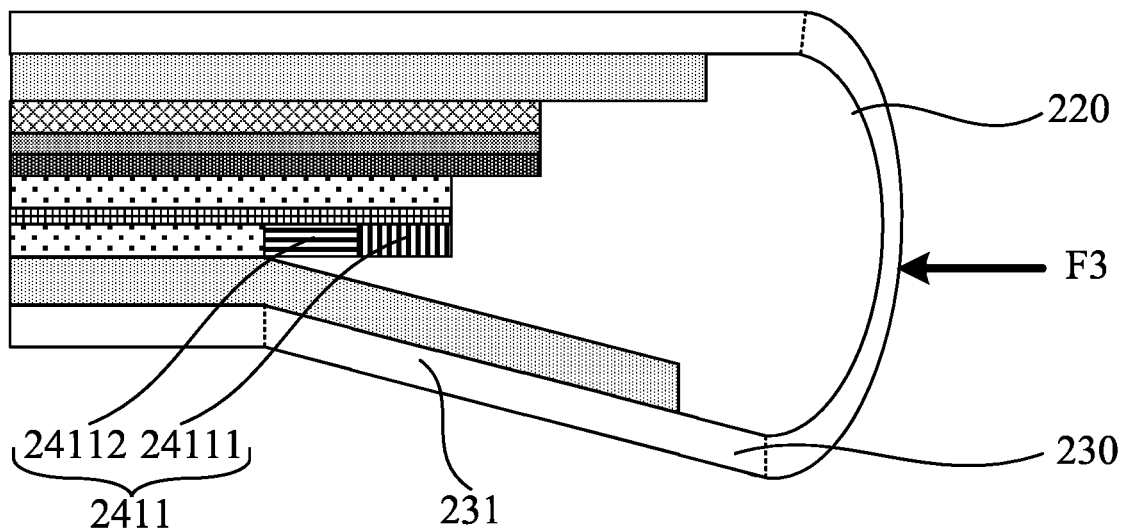
FIG. 6 is a schematic structural diagram of a display module according to FIG. 2, under a stress F3.

FIG. 4 is a schematic structural diagram of a display module according to FIG. 2, under a stress F1, FIG. 5 is a schematic structural diagram of a display module according to FIG. 2, under a stress F2 provided, FIG. 6 is a schematic structural diagram of a display module according to FIG. 2, under a stress F3, where F1<F2<F3. As shown in FIG. 4, two types of pressure sensitive adhesives may be provided as the first adhesive sub-portion 2411. The first pressure sensitive adhesive 24111 is closer to the bending portion 220 than the second pressure sensitive adhesive 24112, and the pressure sensing coefficient of the first pressure sensitive adhesive 24111 is smaller than the pressure sensing coefficient of the second pressure sensitive adhesive 24112. A stress value that may be withstood by the first pressure sensitive adhesive 24111 before failure is smaller than a stress value that can be withstood by the second pressure sensitive adhesive 24112 before failure. In other words, the second pressure sensitive adhesive 24112 can withstand a higher level of stress before failure than the first pressure sensitive adhesive 24111. In a case where the stress applied to the bending portion 220 is F1, in a state where the peel stress applied to the first pressure sensitive adhesive 24111 is less than the ultimate stress value, the first pressure sensitive adhesive 24111 and the second pressure sensitive adhesive 24112 both maintain adhesion and have the adhesion force, and the first bonding sub-portion 231 is not separated from the first adhesive sub-portion 2411, as shown in FIG. 4. In a state where the stress applied to the bending portion 220 increases and reaches F2, the peeling stress applied to the first pressure sensitive adhesive 24111 reaches the ultimate stress value corresponding to the first pressure sensitive adhesive 24111 first, and the first pressure sensitive adhesive 24111 first loses the adhesion and detaches, thus the first pressure sensitive adhesive 24111 is separated from the first bonding sub-portion 231, while the peel stress applied to the second pressure sensitive adhesive 24112 does not reach the ultimate stress value corresponding to the second pressure sensitive adhesive 24112, and the second pressure sensitive adhesive 24112 maintains adhesion, and the second pressure sensitive adhesive 24112 continues to adhere to the first bonding sub-portion 231, as shown in FIG. 5. As the stress on the bending portion 220 continues to increase and reaches F3, the peel stress applied to the second pressure-sensitive adhesive 24112 reaches the ultimate stress value corresponding to the second pressure sensitive adhesive 24112, the second pressure sensitive adhesive 24112 loses adhesion and detaches, and the second pressure sensitive adhesive 24112 is separated from the first bonding sub-portion 231, as shown in FIG. 6. In the embodiments of the present disclosure, two types of pressure sensitive adhesives, i.e., the first pressure sensitive adhesive 24111 and the second pressure sensitive adhesive 24112, are configured in the first adhesive sub-portion 2411, so that the first bonding sub-portion 231 and the first adhesive sub-portion 2411 can be gradually separated in the first state, and the stress that the bonding part 230 withstands can be gradually released. Furthermore, in the state shown in FIG. 5, the first bonding sub-portion 231 continues to adhere to the second pressure sensitive adhesive 24112, thereby continuing to ensure the bonding effect.

Figure 7:
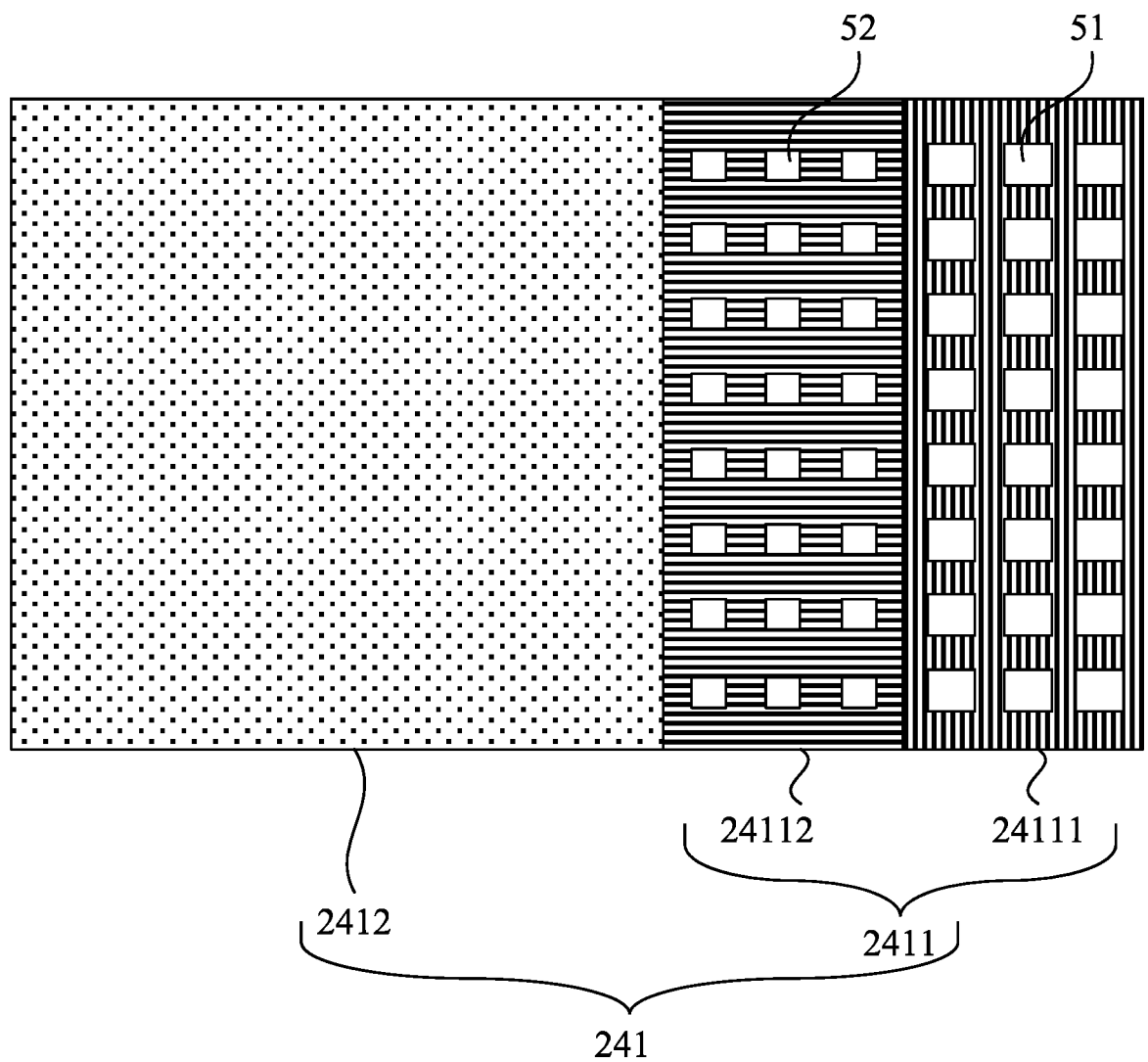
FIG. 7 is a schematic sectional view of a display module, taken along a dashed line CC' in FIG. 4.

FIG. 7 is a schematic sectional view taken along a dashed line CC' in FIG. 4. With reference to the embodiment of FIG. 5, a first patterned structure 51 may be provided at a side of the first pressure sensitive adhesive 24111 facing the first bonding sub-portion 231.

It is understood that the adhesion force of the pressure sensitive adhesive is related to a contact area between the pressure sensitive adhesive and a bonded object in addition to the pressure sensing coefficient. In a case where the pressure sensitive coefficients of the pressure-sensitive adhesives are same, the smaller the contact area between the pressure sensitive adhesive and the bonded object, the smaller the adhesion force of the pressure sensitive adhesive. As shown in FIG. 7, at a side of the first pressure sensitive adhesive 24111 facing the first bonding section 231, a first pattern structure 51 is provided. For example, the first pattern structure 51 may be provided on the surface of the first pressure sensitive adhesive 24111 facing the first adhesive portion 231. The first pressure sensitive adhesive 24111 may be provided as a hollow structure having the first pattern structure 51. In this way, the contact area between the first pressure sensitive adhesive 24111 and the first adhesive portion 231 can be reduced. Further, the adhesive force between the first pressure-sensitive adhesive 24111 and the first adhesive portion 231 is reduced, so that the first pressure-sensitive adhesive 24111 loses adhesion as a result of a smaller peeling stress, and the first pressure-sensitive adhesive 24111 and the first adhesive portion 231 can be separated under a state where the bent portion 220 is subjected to a smaller stress, thereby more effectively releasing the stress and improving the sensitivity of the display module 20 to external stress.

In an embodiment, referring to FIG. 7, at a side of the second pressure sensitive adhesive 24112 facing the first adhesive portion 231, a second patterned structure 52 may be provided. In a unit area, an area of a hollow portion of the first patterned structure 51 may be greater than an area of a hollow portion of the second patterned structure 52.

At a side of the second pressure sensitive adhesive 24112 facing the first bonding sub-portion 231, a second patterned structure 52 is provided. For example, the second patterned structure 52 may be disposed on a surface of the second pressure sensitive adhesive 24112 facing the first bonding sub-portion 231. The second pressure sensitive adhesive 24112 may be configured as a hollow structure having the second patterned structure 52, in this way, a contact area between the second pressure sensitive adhesive 24112 and the first bonding sub-portion 231 may be reduced, thereby reducing the adhesion force between the second pressure sensitive adhesive 24112 and the first bonding sub-portion 231, so that the second pressure sensitive adhesive 24112 loses the adhesion under a smaller peel stress, and the second pressure sensitive adhesive 24111 is able to be separated from the first bonding sub-portion 231 in a state where the bending portion 220 is subjected to a smaller stress, thereby more effectively releasing the stress and improving the sensitivity of the display module 20 to the external stress.

Furthermore, in a unit area, the area of the hollow portion of the first patterned structure 51 may be greater than the area of the hollow portion of the second patterned structure 52, so that a sensitivity of the first pressure sensitive adhesive 24111 to the peel stress is higher than a sensitivity of the second pressure sensitive adhesive 24112 to the peel stress, thereby improving the sensitivity of the display module 20 to an external stress and ensuring good adhesion of the second pressure sensitive adhesive 24112.

It is to be noted that the arrangement of the first patterned structure of the first pressure sensitive adhesive 24111 and the second patterned structure of the second pressure sensitive adhesive 24112 are not limited in the embodiment of the present disclosure, and may be any pattern shape or hollow shape, such as a round hole, a diamond, a grid and the like.

Figure 8:
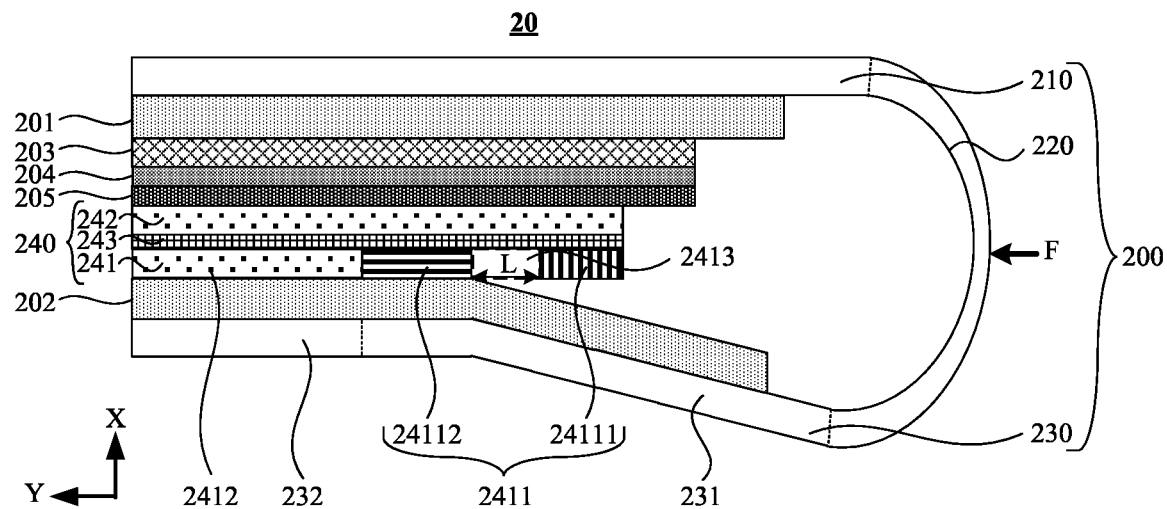
FIG. 8 is a schematic structural diagram of a display module provided by another embodiment of the present disclosure.

FIG. 8 is a structure diagram of a display module provided by another embodiment of the present disclosure. In accordance with the embodiment shown in FIG. 8, a gap 2413 may be provided between the first pressure sensitive adhesive 24111 and the second pressure sensitive adhesive 24112.

The gap 2413 is provided between the first pressure sensitive adhesive 24111 and the second pressure sensitive adhesive 24112. In the first state, a part of the stress may be effectively released, that is, the stress withstood by the first bonding sub-portion 231 is alleviated, thereby avoiding the failure of the first bonding sub-portion 231. Furthermore, a gap 2413 may be provided between the first pressure sensitive adhesive 24111 and the second pressure sensitive adhesive 24112, and it is not necessary that the first pressure sensitive adhesive 24111 is connected with the second pressure sensitive adhesive 24112, so that the flexibility of the first pressure sensitive adhesive 24111 and the second pressure sensitive adhesive 24112 can be enhanced, and a preparation process complexity of the first pressure sensitive adhesive 24111 and the second pressure sensitive adhesive 24112 can be reduced.

In an embodiment, referring to FIG. 6, a length L of the gap 2413 may be defined as $0.05 \text{ mm} \leq L \leq 0.1 \text{ mm}$ in a direction from first adhesive sub-portion 2411 pointing to the second adhesive sub-portion 2412.

Under the premise that a certain bonding effect exists between the first adhesive sub-portion 2411 and the first bonding sub-portion 231 and the display effect is not influenced, a reasonable length L of the gap 2413 between the first pressure sensitive adhesive 24111 and the second pressure sensitive adhesive 24112 may be configured to release the stress as much as possible. Furthermore, the width L of the gap 2413 provided by the embodiment of the present disclosure satisfies $0.05 \text{ mm} \leq L \leq 0.1 \text{ mm}$ in the direction from the first adhesive sub-portion 2411 pointing to the second adhesive sub-portion 2412 and can be achieved by the existing process equipment, thereby reducing the process difficulty in preparing the display module 20 and ensuring a higher preparation efficiency.

Figure 9:
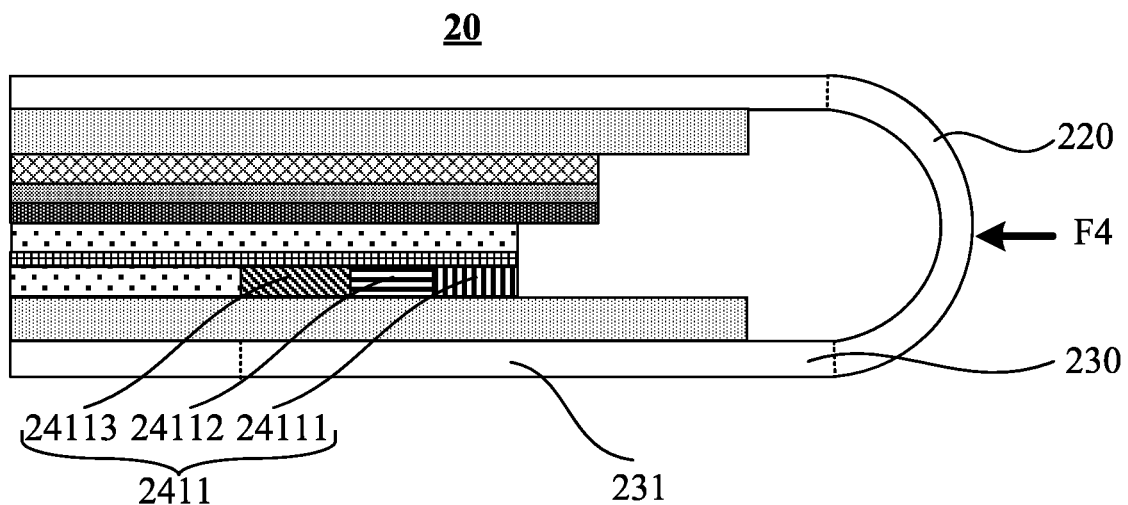
FIG. 9 is a schematic structural diagram of a display module in which three types of pressure sensitive adhesives are incorporated therein, in accordance with an embodiment of the present disclosure.
Figure 10:
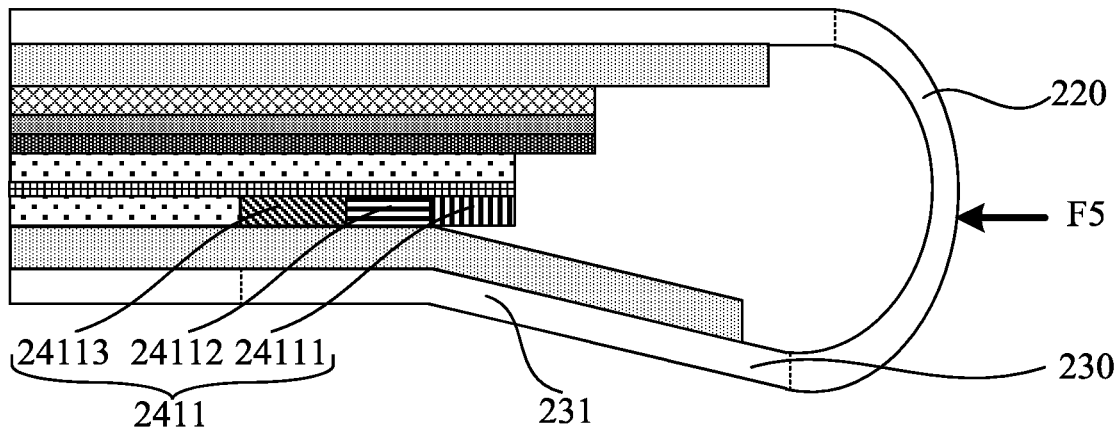
FIG. 10 is a schematic structural diagram of a display module according to FIG. 9, under a stress F5.
Figure 11:
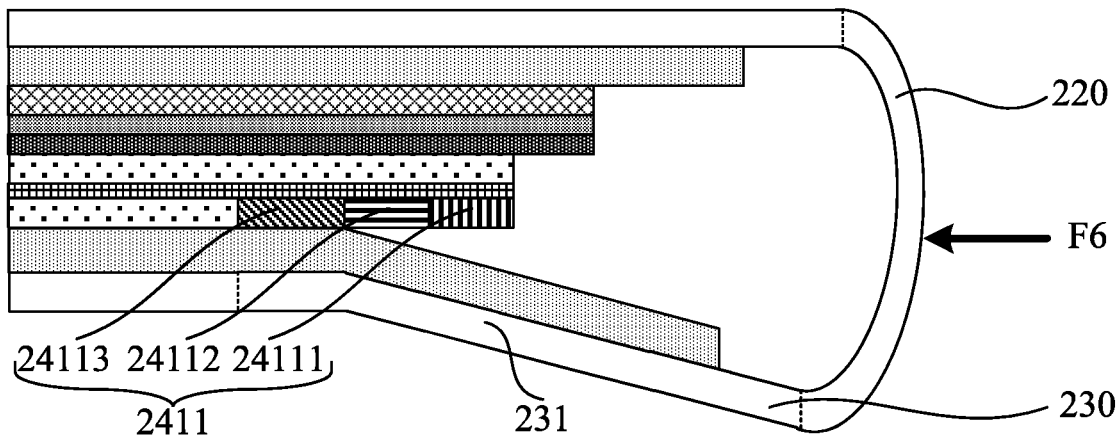
FIG. 11 is a schematic structural diagram of a display module according to FIG. 9, under a stress F6.
Figure 12:
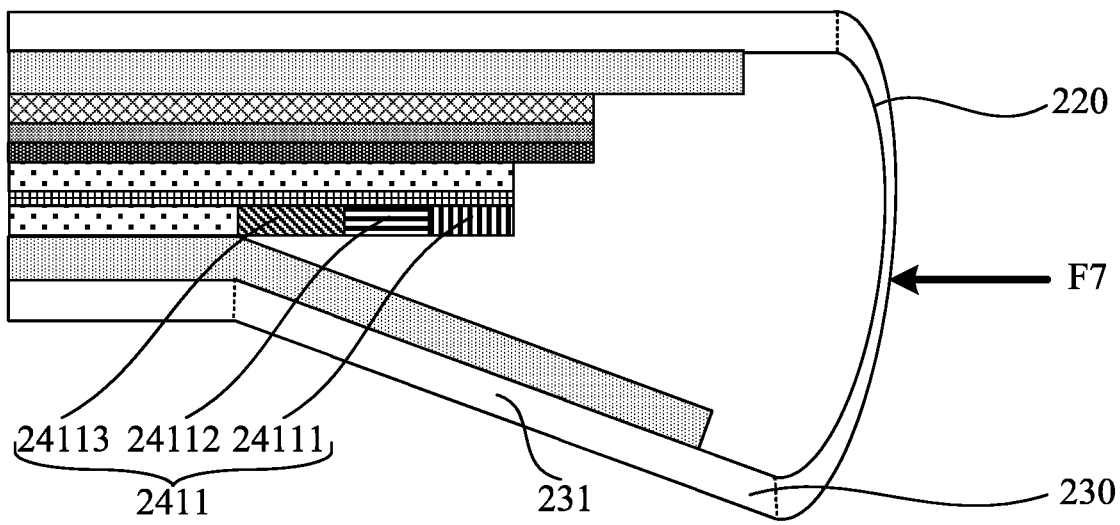
FIG. 12 is a schematic structural diagram of a display module according to FIG. 9, under a stress F7.

In the embodiment of the present disclosure, in the direction from first adhesive sub-portion 2411 pointing to the second adhesive sub-portion 2412, the first adhesive sub-portion 2411 may be provided with multiple types of pressure sensitive adhesives, so that in the first state, the first bonding sub-portion 231 is gradually separated from the first adhesive sub-portion 2411 in a state where the stress applied to the bending portion 220 gradually increases. As an example, embodiments of the present disclosure provide an implementation solution in which three types of pressure sensitive adhesives are adopted for the display module 20 under different stresses. As shown in FIGS. 9 to 12, FIG. 9 is a schematic structural diagram of the display module for which three types of pressure sensitive adhesives are adopted provided by the embodiment of the present disclosure, a stress F4 is applied to the display module 20, FIG. 10 is a schematic structural diagram of a display module according to FIG. 9, under a stress F5, FIG. 11 is a schematic structural diagram of a display module according to FIG. 9, under a stress F6, and FIG. 12 is a schematic structural diagram of a display module according to FIG. 9, under a stress F7, where $F4<F5<F6<F7$. In an embodiment, as shown in FIG. 9, the first adhesive sub-portion 2411 may include a third pressure sensitive adhesive 24113 in addition to the first pressure sensitive adhesive 24111 and the second pressure sensitive adhesive 24112, and the third pressure sensitive adhesive 24113 is located at a side of the second pressure sensitive adhesive 24112 facing away from the bending portion 220. A pressure sensing coefficient of the third pressure-sensitive adhesive 24113 is greater than a pressure sensing coefficient of the second pressure sensitive adhesive 24112.

The first adhesive portion 2411 may include the first pressure sensitive adhesive 24111, the second pressure sensitive adhesive 24112 and the third pressure sensitive adhesive 24113, the pressure sensing coefficient of the first pressure sensitive adhesive 24111 is smaller than the pressure sensing coefficient of the second pressure sensitive adhesive 24112, and the pressure sensing coefficient of the second pressure sensitive adhesive 24112 is smaller than the pressure sensing coefficient of the third pressure sensitive adhesive 24113. Therefore, an ultimate stress value that the first pressure sensitive adhesive 24111 can withstand before failure, an ultimate stress value that the second pressure sensitive adhesive 24112 can withstand before failure, and an ultimate stress value that the third pressure-sensitive adhesive 24113 can withstand before failure are sequentially increased. The stress F applied to the bending portion 220 increases from small to large, the peel stress that the first adhesive sub-portion 2411 withstands also gradually increases. In a case where the peel stress that the first pressure sensitive adhesive 24111 withstands does not reach the ultimate limit stress value, the first pressure sensitive adhesive 24111, the second pressure sensitive adhesive 24112 and the third pressure sensitive adhesive 24113 all have the adhesion and the adhesion force. The first bonding sub-portion 231 is not separated from and continues to bond to the first adhesive sub-portion 2411, as shown in FIG. 9. In a case where the stress applied to the bending portion 220 gradually increases and reaches F5, the peel stress of the first pressure sensitive adhesive 24111 reaches the ultimate stress value corresponding to the first pressure sensitive adhesive 24111, the first pressure sensitive adhesive 24111 first loses adhesion and detaches, and the first pressure sensitive adhesive 24111 is separated from the first bonding sub-portion 231, the peel stress that the second pressure sensitive adhesive 24112 withstands does not reach the ultimate stress value corresponding to the second pressure sensitive adhesive 24112 and the peel stress that the third pressure sensitive adhesive 24113 withstands does not reach the ultimate stress value corresponding to the third pressure sensitive adhesive 24113, so that the second pressure sensitive adhesive 24112 and the third pressure sensitive adhesive 24113 maintains adhesion, the second pressure sensitive adhesive 24112 and the third pressure sensitive adhesive 24113 continue to adhere to the first bonding sub-portion 231, as shown in FIG. 10. In a case where the stress applied to the bending portion 220 continues to increase and reaches F6, the peel stress that the second pressure-sensitive adhesive 24112 withstands reaches the ultimate stress value corresponding to the second pressure sensitive adhesive 24112, the second pressure sensitive adhesive 24112 is separated from the first bonding sub-portion 231, the third pressure sensitive adhesive 24113 continues to adhere to the first bonding sub-portion 231, as shown in FIG. 11. Finally, in a case where the stress applied to the bending portion 220 reaches F7, the peel stress that the third pressure sensitive adhesive 24113 withstands reaches the ultimate stress value corresponding to the third pressure sensitive adhesive 24113, the third pressure sensitive adhesive 24113 is separated from the first bonding sub-portion 231, as shown in FIG. 12. In this case, the first adhesive sub-portion 2411 is completely separated from the first bonding sub-portion 231. In the embodiment of the present disclosure, three types of pressure sensitive adhesives, i.e., the first pressure sensitive adhesive 24111, the second pressure sensitive adhesive 24112 and the third pressure sensitive adhesive 24113, are configured in the first adhesive sub-portion 2411, so that the first bonding sub-portion 231 can be gradually separated from the first adhesive sub-portion 2411 in the first state, and the stress that the bonding portion 230 withstands can be gradually released while continuing to ensure the bonding effect.

The above embodiments describe the implementation solution in which the first adhesive sub-portion 2411 includes the pressure sensitive adhesives, and an implementation solution in which the first adhesive sub-portion 2411 includes the stretchable adhesive is described below in detail.

With reference to the embodiment illustrated in FIG. 3, the first adhesive sub-portion 2411 may include the stretchable adhesive. In the first state, the first adhesive sub-portion 2411 is stretched under the stress, so that the first adhesive sub-portion 2411 adheres to the first bonding sub-portion 231.

The stretchable adhesive is sensitive to the pressure. A shape of the stretchable adhesive can change with changes in the peel stress. In a case where the peel stress is applied to the stretchable adhesive, the shape may be changed, and as the peel stress increases in a direction of subjecting to the stress, the degree of stretch of the stretchable adhesive gradually increases. In a case where the stress F is applied to the bending portion 220, the stretchable adhesive of the first adhesive sub-portion 2411 is subjected to the peel stress and is deformed, that is, the degree of stress starts to change in the first direction, the first bonding sub-portion 231 is separated from the display portion 210 while ensuring that the first adhesive sub-portion 2411 continues to adhere to the first adhesive portion 231, so that a distance H1 between the first bonding sub-portion 231 and the display portion 210 is greater than a distance H2 between the second bonding sub-portion 232 and the display portion 210, and so that the stress is released by stretching the stretchable adhesive to ensure that the first adhesive sub-portion 2411 continues to be bonded to the first bonding sub-portion 231 while ensuring that the stress is released by the first bonding sub-portion 231.

In an embodiment, referring to FIG. 3, in the first state, a stretching length of a side of the first adhesive sub-portion 2411 facing the bending portion 220 may be greater than a stretching length of a side of the first adhesive sub-portion 2411 facing away from the bending portion 220.

The stretchable adhesive is subjected to different stretching forces at different positions, and the degrees of stretch are different at those different positions. In other words, the stretching lengths are different in the direction of subjecting to the stress. In the first state where the bending portion 220 is subjected to the external stress, the peel stress applied to the stretchable adhesive gradually decreases in the direction from the first adhesive sub-portion 2411 pointing to the second adhesive sub-portion 2412. Therefore, in the first adhesive sub-portion 2411, the stretching length of the stretchable adhesive facing the bending portion 220 is greater than the stretching length of the stretchable adhesive facing away from the bending portion 220, ensuring that the stress is normally released.

In a case where the bending portion 220 is not subjected to stress, the distance between the first bonding sub-portion 231 and the display portion 210 is equal to the distance between the second bonding sub-portion 232 and the display portion 210 in the first direction, and the first adhesive sub-portion 2411 adheres to the first bonding sub-portion 231.

The stretchable adhesive deformed by the peel stress has a restorative characteristic, whereby the stretchable adhesive returns to the original unstretched shape when it is not subjected to the peel stress. Therefore, it can be understood that, in a case where the bending portion 220 is not subjected to the external force, the stretchable adhesive of the first adhesive sub-portion 2411 is able to return to an original shape, meanwhile, the first bonding sub-portion 231 may be stretched to rebound together, so that the distance H1 between the first bonding sub-portion 231 and the display portion 210 is equal to the distance H2 between the second bonding sub-portion 232 and the display portion 210, thus ensuring an stable structure of the display module.

The above embodiment describes the implementation solution in which the first adhesive sub-portion 2411 includes the stretchable adhesive, and an implementation solution in which the first adhesive sub-portion 2411 includes the pressure sensitive adhesive and the stretchable adhesive at the same time is described below in detail.

Figure 13:
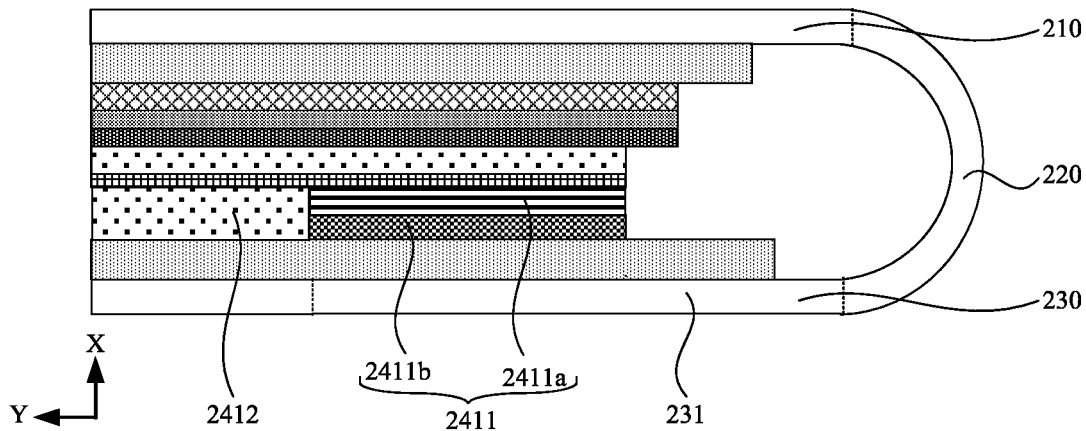
FIG. 13 is a schematic structural diagram of a display module in which a pressure sensitive adhesive and a stretchable adhesive are incorporated therein, in accordance with an embodiment of the present disclosure.
Figure 14:
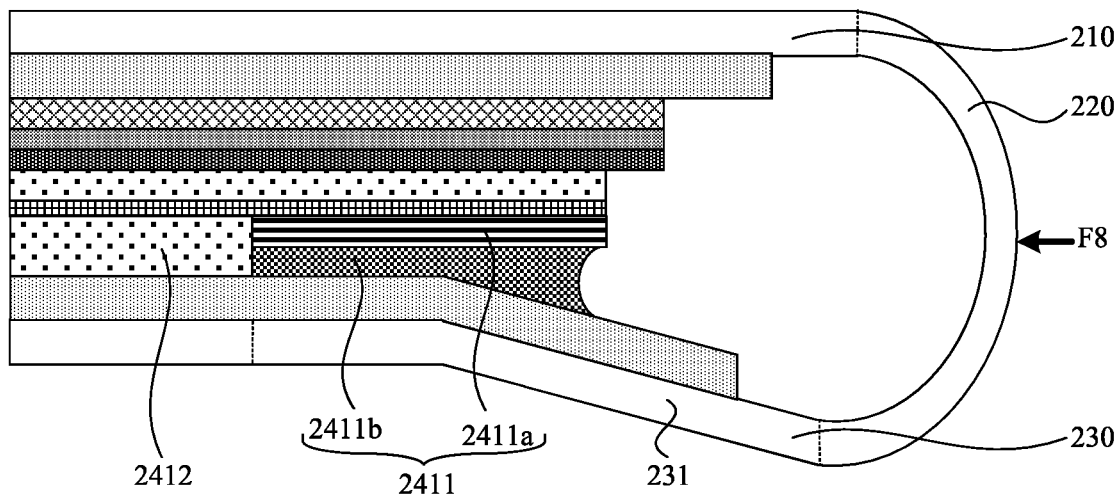
FIG. 14 is a schematic structural diagram of a display module according to FIG. 13, under a stress F8.
Figure 15:
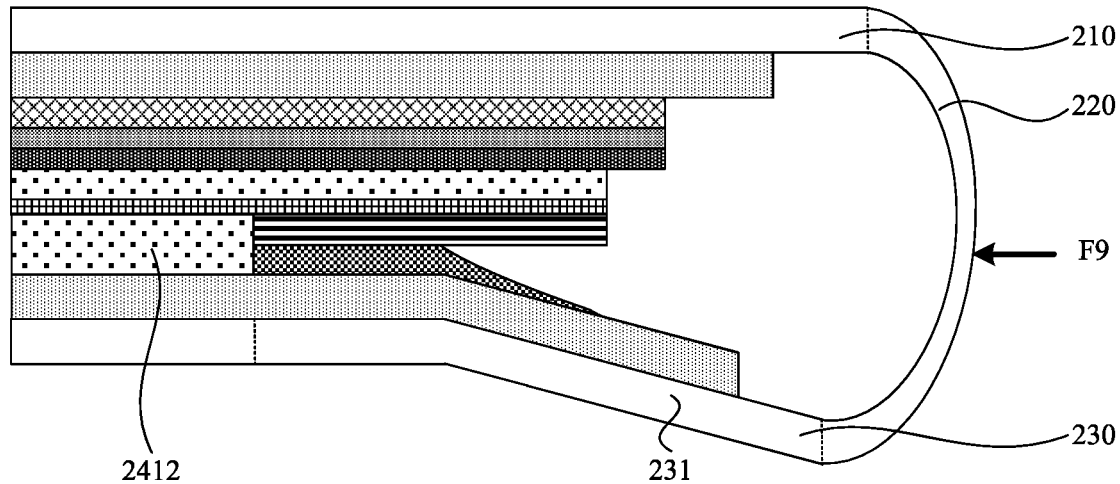
FIG. 15 is a schematic structural diagram of a display module according to FIG. 13, under a stress F9.
Figure 16:
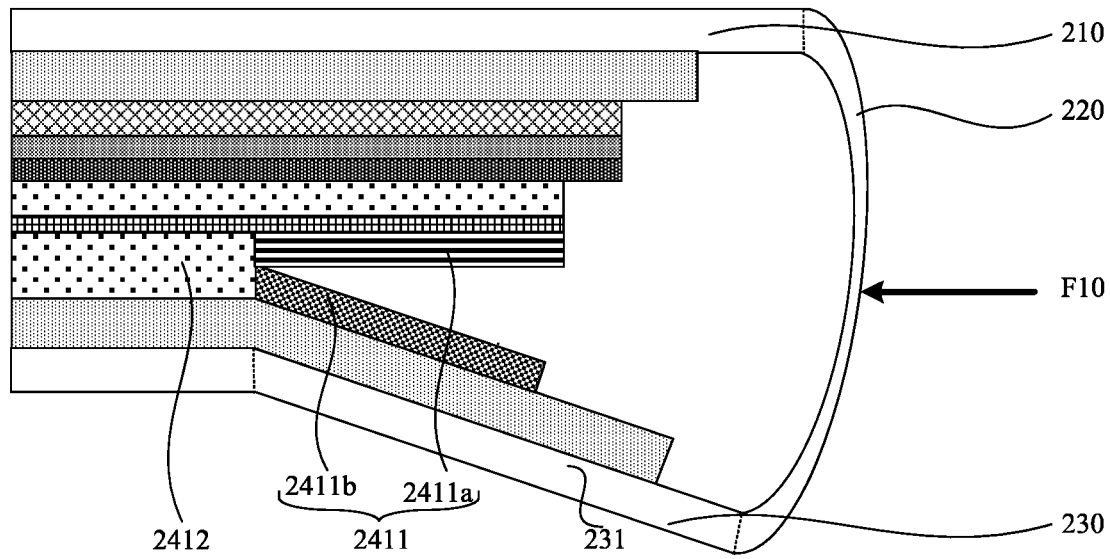
FIG. 16 is a schematic structural diagram of a display module according to FIG. 13, under a stress F10.

FIG. 13 is a schematic structural diagram of a display module for which a pressure sensitive adhesive and a stretchable adhesive are adopted as a part of an embodiment of the present disclosure. FIGS. 14 to 16 are schematic structural diagrams of the display module under different stresses provided in FIG. 13. FIG. 14 is a schematic structural diagram of a display module according to FIG. 13, under a stress F8. FIG. 15 is a schematic structural diagram of a display module according to FIG. 13, under a stress F9. FIG. 16 is a schematic structural diagram of a display module according to FIG. 13, under a stress F10, and F8<F9<F10. In an embodiment, as shown in FIG. 13, a first adhesive portion 2411 may include a pressure sensitive adhesive 2411$a$ and a stretchable adhesive 2411$b$. The pressure sensitive adhesive 2411$a$ is located at a side of the stretchable adhesive 2411$b$ facing a display portion 210 in the first direction. In a second state, the stretchable adhesive 2411$b$ is stretched under a force, and the stretchable adhesive 2411$b$ adheres to the pressure sensitive adhesive 2411$a$, as shown in FIGS. 14 and 15. In a third state, the stretchable adhesive 2411$b$ is separated from the pressure sensitive adhesive 2411$a$, as shown in FIG. 16. A stress that the bending portion 220 withstands in the third state is greater than a stress that the bending portion 220 withstands in the second state.

For example, the second state and the third state may refer to a state in which the bending portion 220 is subjected to an external stress. For example, the bending portion 220 is squeezed or is subjected to the stress at an arc center position of the bending portion 220. The bending portions 220 corresponding to the second state and the third state are squeezed to different degrees, or the stresses that the arc center position of the bending portion 220 withstands are different, specifically, the degree of squeezing force applied at the bending portion 220 in the second state is less than the degree of squeezing force applied at the bending portion 220 in the third state, or the stress that the arc center position of the bending portion 220 withstands in the second state is less than the stress that the arc center position of the bending portion 220 withstands in the third state.

The first adhesive sub-portion 2411 may include both the pressure sensitive adhesive 2411a and the stretchable adhesive 2411b, and the pressure sensitive adhesive 2411a and the stretchable adhesive 2411b have different adhesion states under different stress states. Specifically, in the second state, that is, in a case where the degree of squeezing force applied at the bending portion 220 is relatively small or the stress applied to the arc center position of the bending portion 220, such as F8, is relatively small, the peel stress applied to the first bonding sub-portion 231 is within a range that the stretchable adhesive 2411b can withstand, and the stress is released by stretching the stretchable adhesive. In this case, the pressure sensitive adhesive 2411a adheres to the stretchable adhesive 2411b, as shown in FIG. 14. Furthermore, in a case where the degree of squeezing force applied at the bending portion 220 increases or the stress applied to the arc center position of the bending portion 220 increases and reaches F9, a side of the first adhesive sub-portion 2411 facing the bending portion 220 withstands a larger peel stress, the peel stress applied to a side of the pressure sensitive adhesive 2411a facing the bending portion 220 exceeds an ultimate stress value, but the peel stress applied to a side of the pressure sensitive adhesive 2411a facing away from the bending portion 220 does not exceed the ultimate stress value. In this case, a side of the pressure sensitive adhesive 2411a facing the bending portion 220 fails and detaches, a side of the stretchable adhesive 2411b facing the bending portion 220 is separated from the pressure sensitive adhesive 2411a, and a side of the stretchable adhesive 2411b may continue to adhere to the pressure sensitive adhesive 2411a facing away from the bending portion 220, and a small gap is formed between the stretchable adhesive 2411b and the pressure sensitive adhesive 2411a to release the stress. Meanwhile, a side of the pressure sensitive adhesive 2411a facing away from the bending portion 220 does not fail, the stress can be released by stretching the stretchable adhesive 2411b, as shown in FIG. 15. Furthermore, in a case where the degree of squeezing force of the bending portion 220 increases or the stress applied to the arc center position of the bending portion 220 continues to increase and reaches F10, the peel stress that a side of the pressure sensitive adhesive 2411a facing away from the bending portion 220 withstands also exceeds the ultimate stress value, and a side of the pressure sensitive adhesive 2411a facing away from the bending portion 220 also fails and detaches. In this case, all pressure sensitive adhesive 2411a fails and detaches, the stretchable adhesive 2411b is completely separated from the pressure sensitive adhesive 2411a, and a relatively large gap is formed between the stretchable adhesive 2411b and the pressure sensitive adhesive 2411a to further release the stress, as shown in FIG. 16.

In the embodiment of the present disclosure, the pressure sensitive adhesive and the stretchable adhesive are simultaneously adopted for the first adhesive sub-portion, in the second state where the bending portion is subjected to a relatively small stress, the stress can be released by stretching of the stretchable adhesive. In a case where the stress applied to the bending portion increases, a side of the pressure sensitive adhesive facing the bending portion fails and is separated from the stretchable adhesive, while a side of the pressure sensitive adhesive facing away from the bending portion does not fail and maintains the bonding with the stretchable adhesive, thus ensuring the adhesion effect while further releasing the stress. In the third state where the stress applied to the bending portion continues to increase, a side of the pressure sensitive adhesive facing away from the bending portion fails and is separated from the stretchable adhesive, thereby achieving a maximum stress releasing. By using the solution of combining the pressure sensitive adhesive and the stretchable adhesive, the adhesion between the bonding portion and the display portion can be maintained while the stress that the bonding portion withstands is alleviated, thereby effectively avoiding the failure of the display module.

Figure 17:
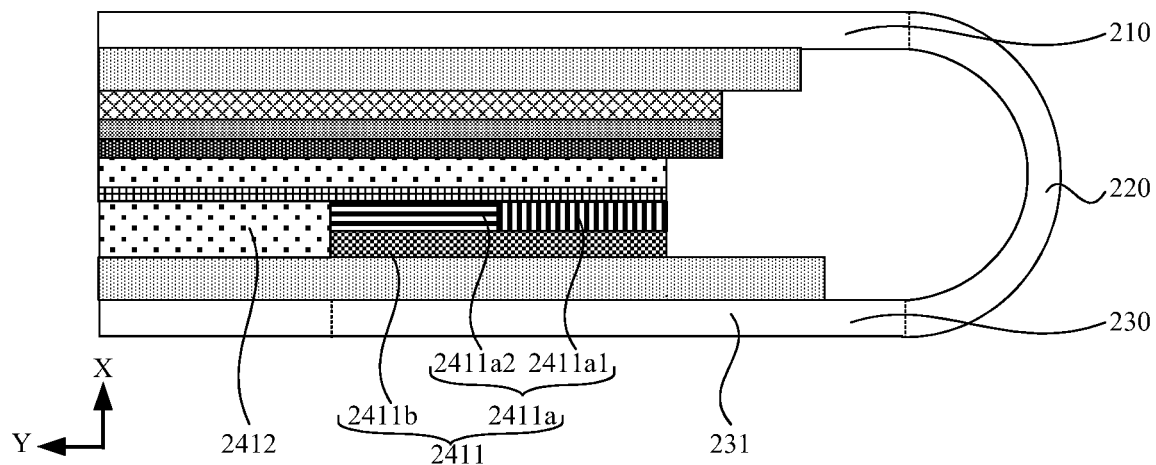
FIG. 17 is a schematic structural diagram of a display module in which a pressure sensitive adhesive and a stretchable adhesive are incorporated therein, in accordance with another embodiment of the present disclosure.

FIG. 17 is a schematic structural diagram of a display module for which a pressure sensitive adhesive and a stretchable adhesive are adopted provided by another embodiment of the present disclosure. In an embodiment, referring to FIG. 17, the pressure sensitive adhesive 2411a may include at least a fourth pressure sensitive adhesive 2411a1 and a fifth pressure sensitive adhesive 2411a2. The fifth pressure sensitive adhesive 2411a2 is located at a side of the fourth pressure sensitive adhesive 2411a1 facing away from the bending portion 220. A pressure sensing coefficient of the fourth pressure sensitive adhesive 2411a1 is smaller than a pressure sensing coefficient of the fifth pressure sensitive adhesive 2411a2. In the third state, at least the fourth pressure sensitive adhesive 2411a1 is separated from the stretchable adhesive 2411b.

The pressure sensitive adhesive 2411a may also be configured as pressure sensitive adhesives with different pressure sensing coefficients. The embodiments of the present disclosure do not limit the types of the pressure sensitive adhesives. For example, two types of pressure sensitive adhesives are identified in FIG. 17, that is, the fourth pressure sensitive adhesive 2411a1 and the fifth pressure sensitive adhesive 2411a2, the pressure sensing coefficient of the fourth pressure sensitive adhesive 2411a1 is smaller than the pressure sensing coefficient of the fifth pressure sensitive adhesive 2411a2, and the fifth pressure sensitive adhesive 2411a2 is located at a side of the fourth pressure sensitive adhesive 2411a1 facing away from the bending part 220. Structures of the display module 20 under different stress states of the bending portion 220 provided in FIG. 17 are similar to structures of the display module 20 provided in FIGS. 14 to 16, which will not be repeated here. In the embodiment of the present disclosure, the fourth pressure sensitive adhesive 2411a1 and the fifth pressure sensitive adhesive 2411a2 are adopted for the first adhesive sub-portion 2411. Meanwhile, in conjunction with the stretchable adhesive 2411b, the stress that the first bonding sub-portion 231 withstands can be better released, and the sensitivity of the display module 20 in response to the external stress can be improved.

In an embodiment, the stretchable adhesive may include a silica gel or an acrylic. Materials of the stretchable adhesive and the pressure sensitive adhesive are not limited in the embodiments of the present disclosure. The pressure sensitive adhesive may be any adhesive that is sensitive to the pressure and can lose adhesion in a state where the peel stress that the adhesive withstands is greater than the ultimate stress value. The stretchable adhesive may be any adhesive which is sensitive to the pressure and whose shape may change with the peel stress that the adhesive withstands, such as the silica gel or the acrylic.

A special adhesive is adopted for the display module provided by the embodiment of the present disclosure, an adhesion or a shape of the special adhesive can change with the peel stress applied to the bonding portion, thus it achieves that in the first state, the distance between the first bonding sub-portion and the display portion is greater than the distance between the second bonding sub-portion and the display portion, thereby alleviating the stress that the bonding portion withstands. Specifically, alleviating the stress can be achieved in three ways. First, the pressure sensitive adhesives with different pressure sensing coefficients are adopted for the first adhesive sub-portion, so that in the first state under different stresses, the first adhesive sub-portion can be separated from the first adhesive sub-portion gradually, so that the stress that the bonding portion is effectively alleviated while the bonding effect is ensured. Second, the stretchable adhesive whose stretching degree varies with the peel stress is adopted for the first adhesive sub-portion, so that in the first state under different stresses, the stretching degree of the stretchable adhesive gradually increases in the direction from the first adhesive sub-portion toward the second adhesive sub-portion, the first adhesive sub-portion is facing away from the display portion and is not separated from the first bonding part, so that the stress that the bonding portion withstands is effectively released while ensuring the bonding effect. Third, the pressure sensitive adhesive is combined with the stretchable adhesive in the first adhesive sub-portion, the pressure sensitive adhesive is disposed on a side of the stretchable adhesive facing away from the first adhesive sub-portion, so that in the second state, the stretchable adhesive is gradually stretched and lengthened and is not separated from the pressure sensitive adhesive portion, while the pressure sensitive adhesive is completely separated from the stretchable adhesive in the third state, thereby effectively releasing the stress that the bonding portion withstands and ensuring the bonding effect at the same time. In the above three embodiments of the present disclosure, in a state where the bending portion is subjected to the stress, the distance between the first bonding sub-portion and the display portion is greater than the distance between the second bonding sub-portion and the display portion, thereby alleviating the stress the bonding portion withstands and ensuring the normal operation of the display module.

Figure 18:
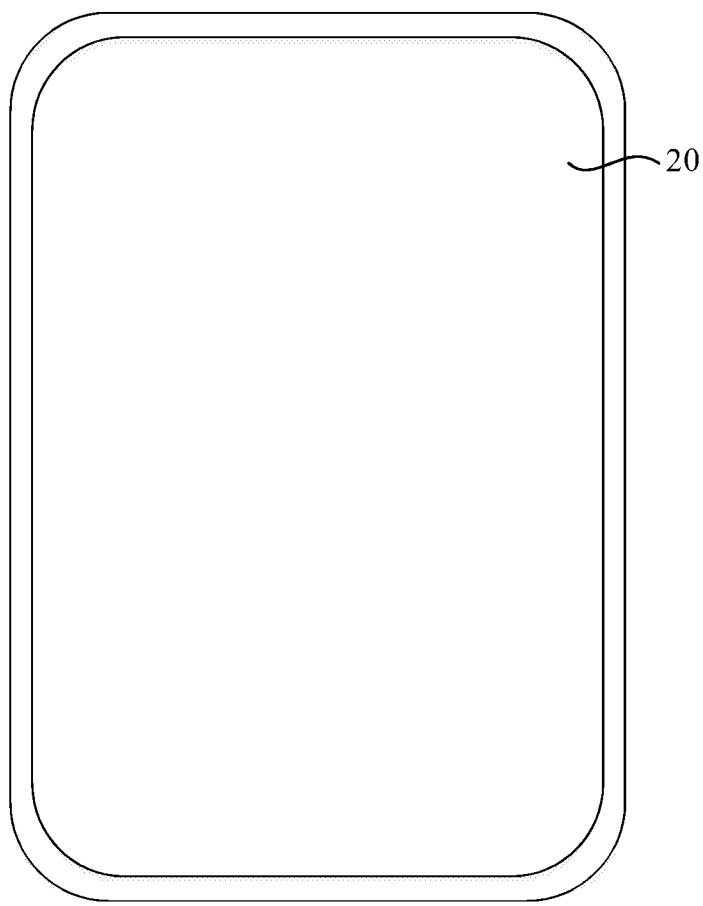
FIG. 18 is a schematic structural diagram of a display device provided by an embodiment of the present disclosure.

On the basis of the embodiments described above, the embodiments of the present disclosure further provide a display device. FIG. 18 is a schematic structural diagram of a display device provided by an embodiment of the present disclosure. As shown in FIG. 18, the display device 1 includes the display module 20 described in any embodiment of the present disclosure described above. Therefore, the display device 1 also has the beneficial effects of the display module 20 described in the preceding embodiments, and for the same details, reference may be made to the description of the preceding display module 20, and repetition will not made herein.

The display device 1 provided in the embodiment of the present disclosure may be a phone shown in FIG. 18, or may be any electronic product with a display function, including but not limited to: televisions, laptops, desktop displays, tablet computers, digital cameras, smart bracelets, smart glasses, in-vehicle displays, industry-controlling equipment, medical displays, touch interactive terminals, etc., which will not be specifically limited in the embodiments of the present disclosure.

It is to be noted that the preceding are only preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display module, comprising:
   a substrate, wherein the substrate comprises a display portion, a bending portion and a bonding portion, wherein the bending portion is located between the display portion and the bonding portion, and the bonding portion is located on a non-light-emitting side of the display portion;
   wherein the display module further comprises an adhesive portion, wherein the adhesive portion is used for bonding the display portion and the bonding portion;
   wherein the adhesive portion comprises a first adhesive portion, wherein the first adhesive portion comprises a first adhesive sub-portion and a second adhesive sub-portion, the second adhesive sub-portion is located at a side of the first adhesive sub-portion facing away from the bending portion;
   wherein the bonding portion comprises a first bonding sub-portion and a second bonding sub-portion, wherein the second bonding sub-portion is located at a side of the first bonding sub-portion facing away from the bending portion, and the first bonding sub-portion and the first adhesive sub-portion at least partially overlap in a first direction, the second bonding sub-portion and the second adhesive sub-portion at least partially overlap in the first direction, and the first direction intersects a light-emitting surface of the display module; and
   wherein in a first state, a distance between the first bonding sub-portion and the display portion is greater than a distance between the second bonding sub-portion and the display portion in the first direction.

2. The display module of claim 1, wherein the first adhesive sub-portion comprises a pressure sensitive adhesive; and
   in the first state, at least a side of the first adhesive sub-portion facing the bending portion is separated from the first bonding sub-portion.

3. The display module of claim 2, wherein the first adhesive sub-portion comprises at least a first pressure sensitive adhesive and a second pressure sensitive adhesive, and the second pressure sensitive adhesive is located at a side of the first pressure sensitive adhesive facing away from the bending portion;
   wherein a pressure sensing coefficient of the first pressure sensitive adhesive is smaller than a pressure sensing coefficient of the second pressure sensitive adhesive; and
   wherein in the first state, at least the first pressure sensitive adhesive is separated from the first bonding sub-portion.

4. The display module of claim 3, wherein a first patterned structure is provided at a side of the first pressure sensitive adhesive facing the first adhesive portion.

5. The display module of claim 4, wherein a second patterned structure is provided at a side of the second pressure sensitive adhesive facing the first bonding sub-portion; and
   wherein in a unit area, an area of a hollow portion of the first patterned structure is greater than an area of a hollow portion of the second patterned structure.

6. The display module of claim 3, wherein a gap is provided between the first pressure sensitive adhesive and the second pressure sensitive adhesive.

7. The display module of claim 6, wherein in a direction from the first adhesive sub-portion to the second adhesive sub-portion, an extension length L of the gap satisfies $0.05$ mm$\leq$L$\leq$0.1 mm.

8. The display module of claim 3, wherein the first adhesive sub-portion further comprises a third pressure sensitive adhesive, and wherein the third pressure sensitive adhesive is located at a side of the second pressure sensitive adhesive facing away from the bending portion; and
wherein a pressure sensing coefficient of the third pressure sensitive adhesive is greater than a pressure sensing coefficient of the second pressure sensitive adhesive.

9. The display module of claim 1, wherein the first adhesive sub-portion comprises a stretchable adhesive; and
wherein in the first state, the first adhesive sub-portion is stretched by a force, and the first adhesive sub-portion adheres to the first bonding sub-portion.

10. The display module of claim 9, wherein in the first state, a stretching length of the first adhesive sub-portion facing the bending portion is greater than a stretching length of the first adhesive sub-portion facing away from the bending portion.

11. The display module of claim 9, wherein in response to the bending portion not being subjected to a stress, a distance between the first bonding sub-portion and the display portion is equal to a distance between the second bonding sub-portion and the display portion in the first direction, and wherein the first adhesive sub-portion adheres to the first bonding sub-portion.

12. The display module of claim 1, wherein the first adhesive sub-portion comprises a pressure sensitive adhesive and a stretchable adhesive, and wherein the pressure sensitive adhesive is located at a side of the stretchable adhesive facing the display portion in the first direction;
wherein in a second state, the stretchable adhesive is stretched by a force, and the stretchable adhesive adheres to the pressure sensitive adhesive; and
wherein in a third state, the stretchable adhesive is separated from the pressure sensitive adhesive and a stress applied to the bending portion in the third state is greater than a stress applied to the bending portion in the second state.

13. The display module of claim 12, wherein the pressure sensitive adhesive comprises at least a fourth pressure sensitive adhesive and a fifth pressure sensitive adhesive, and wherein the fifth pressure sensitive adhesive is located at a side of the fourth pressure sensitive adhesive facing away from the bending portion;
wherein a pressure sensing coefficient of the fourth pressure sensitive adhesive is smaller than a pressure sensing coefficient of the fifth pressure sensitive adhesive; and
wherein in the third state, at least the fourth pressure sensitive adhesive is separated from the stretchable adhesive.

14. The display module of claim 9, wherein the stretchable adhesive comprises a silica gel or an acrylic.

15. A display device, comprising:
a display module, wherein the display module comprises a substrate, wherein the substrate comprises a display portion, a bending portion and a bonding portion, wherein the bending portion is located between the display portion and the bonding portion, and the bonding portion is located on a non-light-emitting side of the display portion;
wherein the display module further comprises an adhesive portion, wherein the adhesive portion is used for bonding the display portion and the bonding portion;
wherein the adhesive portion comprises a first adhesive portion, wherein the first adhesive portion comprises a first adhesive sub-portion and a second adhesive sub-portion, wherein the second adhesive sub-portion is located at a side of the first adhesive sub-portion facing away from the bending portion;
wherein the bonding portion comprises a first bonding sub-portion and a second bonding sub-portion, wherein the second bonding sub-portion is located at a side of the first bonding sub-portion facing away from the bending portion, and the first bonding sub-portion and the first adhesive sub-portion at least partially overlap in a first direction, wherein the second bonding sub-portion and the second adhesive sub-portion at least partially overlap in the first direction, and the first direction intersects a light-emitting surface of the display module; and
wherein in a first state, a distance between the first bonding sub-portion and the display portion is greater than a distance between the second bonding sub-portion and the display portion in the first direction.

16. The display module of claim 15, wherein the first adhesive sub-portion comprises a pressure sensitive adhesive; and
wherein in the first state, at least a side of the first adhesive sub-portion facing the bending portion is separated from the first bonding sub-portion.

17. The display module of claim 16, wherein the first adhesive sub-portion comprises at least a first pressure sensitive adhesive and a second pressure sensitive adhesive, wherein the second pressure sensitive adhesive is located at a side of the first pressure sensitive adhesive facing away from the bending portion;
wherein a pressure sensing coefficient of the first pressure sensitive adhesive is smaller than a pressure sensing coefficient of the second pressure sensitive adhesive; and
wherein in the first state, at least the first pressure sensitive adhesive is separated from the first bonding sub-portion.

18. The display module of claim 17, wherein a first patterned structure is provided at a side of the first pressure sensitive adhesive facing the first adhesive portion.

19. The display module of claim 18, wherein a second patterned structure is provided at a side of the second pressure sensitive adhesive facing the first bonding sub-portion; and
wherein in a unit area, an area of a hollow portion of the first patterned structure is greater than an area of a hollow portion of the second patterned structure.

20. The display module of claim 17, wherein a gap is provided between the first pressure sensitive adhesive and the second pressure sensitive adhesive.

* * * * *